United States Patent [19]

Normann

[11] Patent Number: 4,639,670

[45] Date of Patent: Jan. 27, 1987

[54] MAGNETIC FIELD SENSOR COMPRISING WIEGAND WIRES OR SIMILAR BISTABLE MAGNETIC ELEMENTS

[75] Inventor: Norbert Normann, Pforzheim, Fed. Rep. of Germany

[73] Assignee: Doduco KG Dr. Eugen Durrwachter, Pforzheim, Fed. Rep. of Germany

[21] Appl. No.: 703,769

[22] Filed: Feb. 21, 1985

[30] Foreign Application Priority Data

Feb. 25, 1984 [DE] Fed. Rep. of Germany ....... 3406871

[51] Int. Cl.⁴ .......................................... G01R 33/02
[52] U.S. Cl. .................................. 324/260; 310/152; 324/244; 361/208
[58] Field of Search ................ 310/152, 154; 324/207, 324/208, 260, 244; 361/208, 210; 336/214, 215, 221, 184

[56] References Cited

U.S. PATENT DOCUMENTS

| 3,602,906 | 8/1971 | Wiegand | 307/419 X |
| 4,319,151 | 3/1982 | Klotz | 310/155 X |
| 4,402,034 | 8/1983 | Parker et al. | 361/208 |

Primary Examiner—Gerard R. Strecker
Assistant Examiner—Robert W. Mueller
Attorney, Agent, or Firm—Balogh, Osann, Kramer, Dvorak, Genova & Traub

[57] ABSTRACT

The magnetic field sensor comprises a bundle consisting of a plurality of identical parallel bistable magnetic elements, which are surrounded by respective electrical windings, which are all wound in the same sense and are electrically connected in parallel.

4 Claims, 2 Drawing Figures

MAGNETIC FIELD SENSOR COMPRISING WIEGAND WIRES OR SIMILAR BISTABLE MAGNETIC ELEMENTS

BACKGROUND OF THE INVENTION

1. Field of the Invention

This invention relates to a magnetic field sensor comprising Wiegand wires or similar wirelike bistable magnetic elements.

2. Description of the Prior Art

Wiegand wires are twisted ferromagnetic wires which have a homogeneous composition and consist, e.g., of an iron-nickel alloy comprising preferably 48% iron and 52% nickel, or of a cobalt-iron-vanadium alloy comprising preferably 52% cobalt, 38% iron and 10% vanadium, and which have been subjected to a special mechanical and thermal treatment resulting in the formation of said wires with a soft magnetic core and a hard magnetic shell, which has a higher coercive force than the core. Typical Wiegand wires have a length of 10 to 50 mm, preferably of 20 to 30 mm. When a Wiegand wire which has been magnetized to saturation in a magnetic field having a magnetic field strength of at least 80 A/cm and preferably in excess of 100 A/cm so that the soft magnetic core and the hard magnetic shell are magnetized in the same direction and said Wiegand wire is introduced into an external magnetic field which has the same direction as the axis of the wire and said direction is opposite to the direction of flux in the Wiegand wire, the direction of flux in the soft core of the Wiegand wire will be reversed when the magnetic field strength of said external magnetic field exceeds a value of about 16 A/cm.

That reversal can also be called "resetting" and the magnetic field strength required for that reversal is called "resetting field strength".

When the external magnetic field strength is reversed once more beyond a critical field strength, which is about 8 to 10 A/cm below the resetting field strength and is called "triggering field strength", the direction of flux in the core will be reversed again so that the core and the shell will again have the same directions of flux. That phenomenon is called the "triggering" of the Wiegand wire. That reversal of the direction of flux takes place very quickly and is accompanied by a correspondingly large change of the magnetic flux per unit of time (Wiegand effect). That change of the magnetic flux can induce a short and very strong voltage pulse (Wiegand pulse) of up to about 12 volts in an induction winding, which is called detector winding and the number of turns and the load resistance of which will determine the induced voltage. Wiegand pulses have a duration of about 20 microseconds. As a rule, the detector winding has between 1000 and 4000 turns, in most cases about 2000 turns, and a diameter below 3 mm, in most cases between 2.0 and 2.5 mm. If the Wiegand wire lies in a magnetic field which is reversed from time to time and which is so strong that it can reverse the magnetization first of the core (at the lower triggering field strength) and subsequently also of the shell (at a higher field strength) and can effect saturation in each case, the reversal of the direction of flux in the soft magnetic core will result in the generation of Wiegand pulses of positive and negative polarities in alternation. This is described as a symmetrical excitation of the Wiegand wire. For this purpose field strengths from about −(80 to 120 A/cm) to +(80 to 120 A/cm) called "saturating field strengths", are required. The reversal of the direction of flux in the shell takes also suddenly and results in a pulse in the detector winding but that pulse is much smaller than the pulse induced by the preceding reversal of the direction of flux in the core.

If the selected external magnetic field can reverse only the direction of flux in the soft core but cannot reverse the direction of flux in the hard shell, the strong Wiegand pulses which are generated will have only one polarity. This result is described as an asymmetric excitation of the Wiegand wire. For this purpose a field strength of at least 16 A/cm is required in one direction (for resetting the Wiegand wire) and a field strength of about 80 to 120 A/cm is requried in the opposite direction.

It is typical of the Wiegand effect that the amplitude and width of the pulses which are generated by it are substantially independent of the rate of change of the external magnetic field and that they have a high signal-to-noise ratio.

The invention is also applicable to other bistable magnetic elements, which have two magnetically coupled regions which differ in hardness (coercive force), and like Wiegand wires can be used to generate pulses by a quick reversal of the direction of flux throughout the soft magnetic region by a large Barkhausen jump. For instance, German patent specification No. 25 14 131 discloses a bistable magnetic switching core in the form of a wire having a hard magnetic core, e.g., of a nickel-cobalt alloy, an electrically conductive intermediate layer, e.g., of copper, deposited on the core, and a surface layer, which has been deposited on said intermediate layer and consists of a soft-magnetic material, e.g. of a nickel-iron alloy. In another embodiment, the core consists of a magnetically non-conducting but electrically conducting metallic inner conductor, which has a high reluctance and consists, e.g., of a beryllium-copper alloy and on which first the hard magnetic layer, then the intermediate layer and finally the soft magnetic layer have been deposited. The pulses generated by such a bistable magnetic element will be smaller than those generated by a Wiegand wire.

Another bistable magnetic element consisting of two layers has been disclosed in EP-A2-0 085 140 and is similar to the bistable magnetic element known from German patent specification No. 25 14 131 in that a hard magnetic core is surrounded by a soft magnetic core which differes in composition from the core. But different from the bistable magnetic element known from German patent specification No. 25 14 131 that layer has been twisted.

Such bistable magnetic elements may be used instead of Wiegand wires within the scope of the invention even if they have no homogeneous composition.

Magnetic field sensors comprising Wiegand wires consist in the simplest case of a Wiegand wire and an electric winding, called detector winding, which is wound around the Wiegand wire. Such magnetic field sensor affords the advantage that it can be excited to deliver Wiegand pulses even when the sensor is not supplied with electric power. The energy required for the pulses is taken from the magnetic field, which acts on the Wiegand wire and reverses the direction of magnetic flux in the wire when the requirements for an asymmetrical or symmetrical excitation described hereinbefore have been met. But that advantage afforded by such magnetic field sensor cannot be fully utilized unless the generated pulses can be transmitted over a certain distance without a need for a supply of additional energy because the energy required for the transmission is derived from the pulse generated by the magnetic field sensor. Specifically, it would be desirable to transmit the pulse generated by the magnetic field sensor wireless and not referred to a potential, e.g., by means of a radiofrequency transmitter which is directly energized and controlled by the magnetic field sensor, or by an optical fiber link having at the transmitting end a light-emitting diode which is energized directly by the magnetic field sensor.

Investigations have shown that the energy of the pulses which can be generated by a Wiegand wire or similar bistable magnetic element is insufficient in most cases for such applications. For this reason it has already been attempted to bundle a plurality of Wiegand wires and to surround the resulting bundle with a common detector winding so that the pulse energy delivered by the magnetic field sensor will be multiplied. But it has been found that a magnetic field sensor comprising a bundle of Wiegand wires will generate a strongly jittering burst rather than the desired single pulse having a high energy.

A bundle of Wiegand wires does not induce a common single pulse in a surrounding electrical winding because owing to inevitable slight variations in material composition the direction of magnetic flux in different Wiegand wires is reversed at slightly different field strengths, i.e., at different times. This effect is intensified by the fact that in a bundle of Wiegand wires the magnetic field of that Wiegand wire in which the direction of magnetic flux is reversed first will weaken the external magnetic field used to apply the triggering field strength for the Wiegand wires so that adjacent Wiegand wires having such a material composition that they require a somewhat higher triggering field strength than the Wiegand wire which has been triggered first will be triggered even later in the bundle than if they were independent Wiegand wires.

SUMMARY OF THE INVENTION

It is an object of the invention to provide a magnetic field sensor which is of the kind described first hereinbefore and is capable of delivering an individual pulse which has a higher energy content than the pulse usually delivered by a single bistable magnetic element and in which that higher pulse energy is produced without a need for a supply of electric power.

In a magnetic field sensor comprising Wiegand wires or similar wirelike bistable magnetic elements, which will be designated BME hereinafter, and an electrical winding surrounding said bistable magnetic elements, that object is accomplished by the provision of a bundle of identical, parallel bistable magnetic elements, each of which is surrounded by a separate magnetic winding, wherein all said windings are wound in the same sense and are electrically connected in parallel.

The magnetic field sensor in accordance with the invention has the following mode of operation: When the magnetic field sensor is exposed to a change of a magnetic field strength resulting in a symmetrical or unsymmetrical excitation of its bistable magnetic elements, a rise of that magnetic field strength to the triggering field strength will trigger that BME which owing to slight variations in material composition has the lowest triggering field strength. This means that the direction of magnetic flux in that BME will be suddenly reversed so that a voltage pulse will be induced in known manner in the electrical winding surrounding that BME. As that electrical winding is connected in parallel to the other electrical windings surrounding the other bistable magnetic elements of the magnetic field sensor, all said windings will be flown through by the electric currents depending on the amplitude of the pulse induced in the winding which surrounds the BME that has been triggered first. The currents flowing in the electrical windings will generate magnetic fields around said bistable magnetic elements and said magnetic fields will assist the action of the external magnetic field on the entire bundle. As a result, the other bistable magnetic elements of the bundle will be subjected to their respective triggering field strengths more quickly than this would be the case if they were independent bistable magnetic elements. Like the triggering of the first BME, the second BME which is triggered will assist the action of the external magnetic field so that a chain reaction is effected which produces a self-amplification effect increasing like an avalanche. As a result, all bistable magnetic elements of the bundle will be triggered in such a rapid succession that a single voltage pulse will appear at the joint output terminals of the electrical windings, which are connected in parallel. In practice, that single pulse will have virtually the same duration as a pulse which would have been generated by a single independent BME.

The magnetic field sensor in accordance with the invention exhibits the same behavior as a single independent BME which is surrounded by an electric coil and delivers the same pulse amplitude but the sensor has a source impedance which is smaller by a factor n than such single BME, where n is the number of bimetallic elements of the bundle, provided that the bistable magnetic elements of the bundles are provided with identical windings. This is certainly desirable but the electrical windings associated with the bundle might also be different.

The bistable magnetic elements which are juxtaposed in a bundle should be identical so that they have substantially the same triggering field strength except for the differences which are due to inevitable slight variations in composition.

The magnetic field sensor in accordance with the invention will operate satisfactory if the bundle comprises two or more bistable magnetic elements. An upper limit of the number of bistable magnetic elements which can be used in a bundle will be imposed by the requirement that the bundle should not be so large that it would excessively disturb the geometry of the external magnetic field. A magnetic field sensor comprising a bundle of ten Wiegand wires provided with windings which are smaller than 3 mm in diameter and have 1000 to 4000 turns has been tested with satisfactory results. For numerous applications a bundle containing 3 to 5 bistable magnetic elements will be sufficient. A magnetic field sensor comprising only two Wiegand wires has been used satisfactorily to operate a commercially available optical fiber link having a length of 5 meters.

DETAILED DESCRIPTION OF THE PREFERRED EMBODIMENT

Figure 1:
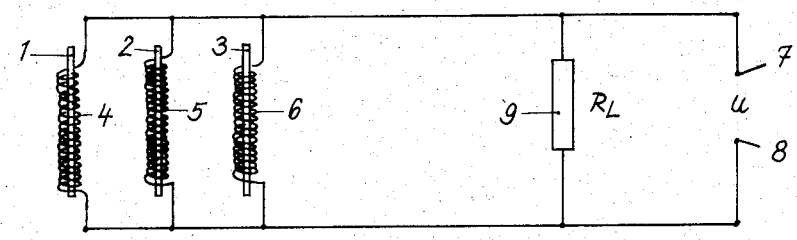
FIG. 1 is a circuit diagram showing a magnetic field sensor comprising a set of three Wiegand wires.
Figure 2:
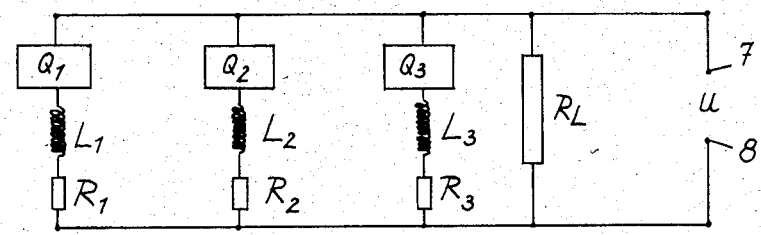
FIG. 2 is an electric equivalent circuit diagram of the sensor shown in FIG. 1.

The illustrated magnetic field sensor comprises three Wiegand wires, 1, 2, and 3, each of which carries an electrical winding 4, 5 or 6, respectively. The windings have the same number of turns, the same inductance and the same resistance and have been wound on the same sense and are connected in parallel to each other. The winding-carrying Wiegand wires 1, 2 and 3 are parallel to each other and closely spaced apart. The parallel windings 4, 5 and 6 are connected at oppostie ends to common terminals 7 and 8, which are connected by a load resistance 9. The latter may be constituted, e.g., by the input resistance of a light-emitting diode used as a transmitter diode for an optical fiber link.

That arrangement appears to consist simply of a plurality of inductors connected in parallel but in fact has an extremely nonlinear electric function because each winding 4, 5, 6 surrounds a core which consists of a Wiegand wire 1, 2 or 3, respectively. Each of these windings 4, 5 and 6 may be regarded in a first approximation as a series circuit of its air inductance $L1$ or $L2$ or $L3$, a resistance $R1$ or $R2$ or $R3$ and a controlled pulse voltage source $Q1$ or $Q2$ or $Q3$. The pulse voltage is generated for about 20 microseconds as soon as one of the Wiegand wires 1, 2 and 3 is subjected to its triggering field strength. The triggering field strength is primarily due to the action of an external magnetic field but that action will be assisted by the magnetic fields generated by a current which flows through electrical windings 4, 5 and 6 as soon as any of the Wiegand wires has been triggered. The external magnetic field may be generated in any desired manner, for instance, by permanent magnets but also by electromagnets. Alternatively the windings 4, 5 and 6 or separate windings provided on the respective Wiegand wires 1, 2 and 3 may be connected to an external variable power source, e.g., an a.c. source, so that said separate windings will generate a magnetic field around the Wiegand wires. But such an arrangement will not afford the advantage which is typical of Wiegand wires that they can operate without a need for an external power supply.

Technical data of a practical magnetic field sensor will be stated hereinafter.

Each Wiegand wire 1, 2 or 3 had a length of 18 mm and a thickness of 0.25 mm and had a nominal triggering field strength of 10 A/cm in case of asymmetrical excitation. Each Wiegand wire carried an electrical winding which had 4000 turns and an internal resistance of 250 ohms. Each winding had a length of 15 mm. If the load 9 consisted of a light-emitting transmitter diode as is conventionally used with an optical fiber link, the asymmetrical excitation of the Wiegand wires resulted in a generation of pulses having a current amplitude of 8 mA and a duration of almost 20 microseconds.

I claim:

1. In a sensor for sensing an external magnetic field, comprising
   wire form bistable magnetic elements and
   electrical detector winding means surrounding said bistable magnetic elements,
   the improvement residing in that
   said bistable magnetic elements comprise a bundle of identical bistable magnetic elements which extend parallel to each other, and
   said electrical detector winding means comprise a plurality of electrical detector windings which surround respective ones of said bistable magnetic elements and are wound in the same sense and are electrically connected in parallel.

2. The improvement set forth in claim 1, wherein said bundle consists of three to five of said bistable magnetic elements.

3. The improvement set forth in claim 1, wherein said bistable elements surrounded by respective ones of said windings are closely packed in said bundle.

4. The improvement set forth in claim 2, wherein said bistable elements surrounded by respective ones of said windings are closely packed in said bundle.

* * * * *